United States Patent
Zheng et al.

(10) Patent No.: US 11,828,481 B2
(45) Date of Patent: Nov. 28, 2023

(54) BUILDING CONTROLLER WITH ADAPTABLE MOUNT

(71) Applicant: Honeywell International Inc., Charlotte, NC (US)

(72) Inventors: Xinyan Zheng, Beijing (CN); Michael Zheng, Beijing (CN); Hang Su, Chongqing (CN); Haitao Li, Beijing (CN); Li Chen, Beijing (CN); Kun Wang, Beijing (CN); Cary Leen, Hammond, WI (US)

(73) Assignee: HONEYWELL INTERNATIONAL, INC., Charlotte, NC (US)

( * ) Notice: Subject to any disclaimer, the term of this patent is extended or adjusted under 35 U.S.C. 154(b) by 391 days.

(21) Appl. No.: 17/073,044

(22) Filed: Oct. 16, 2020

(65) Prior Publication Data

US 2022/0120466 A1   Apr. 21, 2022

(51) Int. Cl.
*F24F 11/89*   (2018.01)
*H05K 7/12*    (2006.01)
(Continued)

(52) U.S. Cl.
CPC ............ *F24F 11/89* (2018.01); *H02B 1/0523* (2013.01); *H05K 7/12* (2013.01); *F24F 1/30* (2013.01)

(58) Field of Classification Search
CPC . F24F 11/89; F24F 11/30; H05K 7/12; H05K 7/1474; H05K 7/1401; H05K 7/183;
(Continued)

(56) References Cited

U.S. PATENT DOCUMENTS

| | | | |
|---|---|---|---|
| 4,254,453 A | 3/1981 | Mouyard et al. | |
| 4,714,983 A | 12/1987 | Lang | |

(Continued)

FOREIGN PATENT DOCUMENTS

| | | |
|---|---|---|
| DE | 4125034 A1 | 2/1993 |
| EP | 2677846 A1 | 12/2013 |

(Continued)

OTHER PUBLICATIONS

Six (6) Photos of Fluke 87 Multimeter, DCS 186, DCS 188, DCS 189, DCS 192, DCS 193, DCS 194, prior to Oct. 25, 2006.

(Continued)

*Primary Examiner* — Steven S Anderson, II
*Assistant Examiner* — Andrew W Cheung
(74) *Attorney, Agent, or Firm* — Seager, Tufte & Wickhem, LLP

(57) ABSTRACT

A building controller may include a housing having a back plate and a mounting clip, which may be slidably disposed relative to the back plate between a wall mount position used when mounting the building controller to the wall, and a DIN rail mount position used when mounting the building controller to a DIN rail. When in the wall mount position, the mounting clip and the back plate may be configured to hold the mounting clip in the wall mount position until at least a first threshold sliding force is applied to the mounting clip. When in the DIN rail mount position, the mounting clip and the back plate are configured to hold the mounting clip in the DIN rail mount position until at least a second threshold sliding force is applied to the mounting clip.

13 Claims, 14 Drawing Sheets

(51) Int. Cl.
  *H02B 1/052* (2006.01)
  *F24F 11/30* (2018.01)
  *F24F 1/30* (2011.01)

(58) Field of Classification Search
  CPC .... H05K 7/1488; H02B 1/0523; H02B 1/052; F16M 13/022
  USPC ........................................................ 361/747
  See application file for complete search history.

(56) References Cited

U.S. PATENT DOCUMENTS

| | | | |
|---|---|---|---|
| 5,090,922 A * | 2/1992 | Rymer | H01R 9/2608 439/716 |
| 5,103,373 A | 4/1992 | Rusch et al. | |
| 5,327,328 A | 7/1994 | Simms et al. | |
| 5,613,751 A | 3/1997 | Parker et al. | |
| 5,618,096 A | 4/1997 | Parker et al. | |
| 5,675,123 A | 10/1997 | Proctor et al. | |
| 5,694,288 A * | 12/1997 | Shortt | H02G 1/081 439/716 |
| 5,761,026 A | 6/1998 | Robinson et al. | |
| 5,768,091 A | 6/1998 | Vinson et al. | |
| 5,775,955 A * | 7/1998 | Graube | H01R 9/2658 439/716 |
| 5,803,573 A | 9/1998 | Osawa et al. | |
| 5,876,107 A | 3/1999 | Parker et al. | |
| 5,904,592 A * | 5/1999 | Baran | H02B 1/052 361/627 |
| 5,951,152 A | 9/1999 | Zabawski et al. | |
| 6,045,249 A | 4/2000 | Bellinghausen et al. | |
| 6,079,838 A | 6/2000 | Parker et al. | |
| 6,292,076 B1 | 9/2001 | DeGrazia et al. | |
| 6,563,697 B1 | 5/2003 | Simbeck et al. | |
| 6,671,013 B1 | 12/2003 | Ohkawa | |
| 6,848,801 B2 | 2/2005 | Miyashita | |
| 7,001,058 B2 | 2/2006 | Inditsky | |
| 7,004,613 B2 | 2/2006 | Sun et al. | |
| 7,186,015 B2 | 3/2007 | Kimmet et al. | |
| 7,374,453 B1 * | 5/2008 | Allcock | E01B 9/38 439/716 |
| 7,674,129 B1 * | 3/2010 | Liu | H02B 1/052 439/716 |
| 7,758,368 B2 | 7/2010 | Schelonka et al. | |
| 7,980,891 B2 | 7/2011 | Molnar | |
| 8,062,061 B2 * | 11/2011 | Lim | H02B 1/052 439/716 |
| 8,469,737 B2 | 6/2013 | Correll et al. | |
| 8,542,499 B2 | 9/2013 | Skull | |
| 9,088,138 B2 | 7/2015 | Yu | |
| 9,312,667 B2 * | 4/2016 | Cachia | H02B 1/0526 |
| 9,374,924 B2 | 6/2016 | Boretti | |
| 9,386,718 B2 * | 7/2016 | Kusumi | H05K 7/12 |
| 9,444,231 B2 | 9/2016 | Ho et al. | |
| 9,545,027 B2 | 1/2017 | Chiang | |
| 9,819,157 B2 | 11/2017 | Tsutsumi et al. | |
| 9,967,995 B2 * | 5/2018 | Molnar | H05K 5/0026 |
| 10,483,725 B2 * | 11/2019 | Merz | H01R 25/162 |
| 2004/0240193 A1 | 12/2004 | Mertz et al. | |
| 2005/0231935 A1 | 10/2005 | Kimmet et al. | |
| 2007/0144682 A1 | 6/2007 | Drew et al. | |
| 2008/0108248 A1 * | 5/2008 | Lim | H02B 1/052 361/807 |
| 2010/0285690 A1 * | 11/2010 | Molnar | H01R 9/2608 361/825 |
| 2010/0314522 A1 * | 12/2010 | Molnar | H02B 1/052 248/346.06 |
| 2011/0269339 A1 * | 11/2011 | Baran | H05K 7/1474 439/532 |
| 2016/0295733 A1 * | 10/2016 | Chiang | H05K 7/1474 |

FOREIGN PATENT DOCUMENTS

| | | | |
|---|---|---|---|
| EP | 2869678 A1 | 5/2015 | |
| FR | 2722360 A1 | 1/1996 | |
| JP | 2005135945 A | 5/2005 | |
| JP | 2003298252 A | 10/2013 | |
| WO | 0050807 A1 | 8/2000 | |
| WO | WO-2017129452 A1 * | 8/2017 | .......... F16M 13/022 |

OTHER PUBLICATIONS

Honeywell, Everest Relesaed, accessed Mar. 2019.
Five (5) Photos of Honeywell Thermostat, DCS 201, DSC 202, DSC 206, DCS 208, DCS 211, prior to Oct. 25, 2006.
Honeywell, Comfort Point Open, CPO-PC 400 Plant Controller, 2019.
Novelty Search Report IDF-220582 dated Aug. 21, 2020.
Extended European Search Report, EP Application No. 21201081.3, dated Feb. 28, 2022 (15 pgs).

\* cited by examiner

US 11,828,481 B2

BUILDING CONTROLLER WITH ADAPTABLE MOUNT

TECHNICAL FIELD

The present disclosure relates generally to building controllers. More particularly, the present disclosure relates to mounts for such building controllers.

BACKGROUND

Building controllers are commonly used in dwellings, buildings, and other controlled spaces for controlling and/or monitoring HVAC systems, security systems, lighting systems, and the like. In many cases, the building controllers are mounted to a wall in the controlled space. When so provided, the building controllers are often mounted directly to the wall using fasteners such as screws, nails, etc., or alternatively to a wall via a DIN rail. It is often not known in advance what type of mount will work best for a particular installation. What would be desirable is an adaptable mount that is adaptable in the field to mount the building controller either directly to a wall or to a DIN rail, depending on the application at hand.

SUMMARY

The present disclosure relates generally to building controllers. More particularly, the present disclosure relates to an adaptable mount that is adaptable in the field to mount the building controller either directly to a wall or to a DIN rail depending on the application at hand. In one example, a building controller may be configured to be mountable to a wall in some installations and mountable to a DIN rail in other installations.

The building controller may include a housing having a back plate and a mounting clip which may be slidably disposed relative to the back plate between a wall mount position, used when mounting the building controller to the wall, and a DIN rail mount position, used when mounting the building controller to a DIN rail. In some cases, when in the wall mount position, the mounting clip and the back plate may be configured to hold the mounting clip in the wall mount position until at least a first threshold sliding force is applied to the mounting clip to displace the mounting clip from the wall mount position. In some cases, when in the DIN rail mount position, the mounting clip and the back plate are configured to hold the mounting clip in the DIN rail mount position until at least a second threshold sliding force is applied to the mounting clip to displace the mounting clip from the DIN rail mount position.

In some instances, a building controller may include a housing having a back plate, wherein the back plate may define a slot. A mounting clip may be configured to fit within and slide along the slot. The mounting clip and/or the back plate may define one or more detents that may be configured to hold the mounting clip in a first position until at least a first threshold sliding force is applied to the mounting clip to displace the mounting clip along the slot from the first mount position, and may be configured to hold the mounting clip in a second mount position until at least a second threshold sliding force is applied to the mounting clip to displace the mounting clip along the slot from the second mount position.

In some cases, a method may include applying at least a first threshold sliding force to a mounting clip of a building controller to slide the mounting clip from a first position toward a second position, wherein in the second position a securement feature of the mounting clip may be accessible for receiving a fastener to secure the building controller to a wall. The method may further include applying at least a second threshold sliding force to the mounting clip of the building controller to slide the mounting clip of the building controller from the second position toward the first position, wherein in the first position at least part of the mounting clip may be positioned to engage a DIN rail.

The preceding summary is provided to facilitate an understanding of some of the innovative features unique to the present disclosure and is not intended to be a full description. A full appreciation of the disclosure can be gained by taking the entire specification, claims, figures, and abstract as a whole.

BRIEF DESCRIPTION OF THE FIGURES

The disclosure may be more completely understood in consideration of the following description of various examples in connection with the accompanying drawings, in which.

Figure 1:
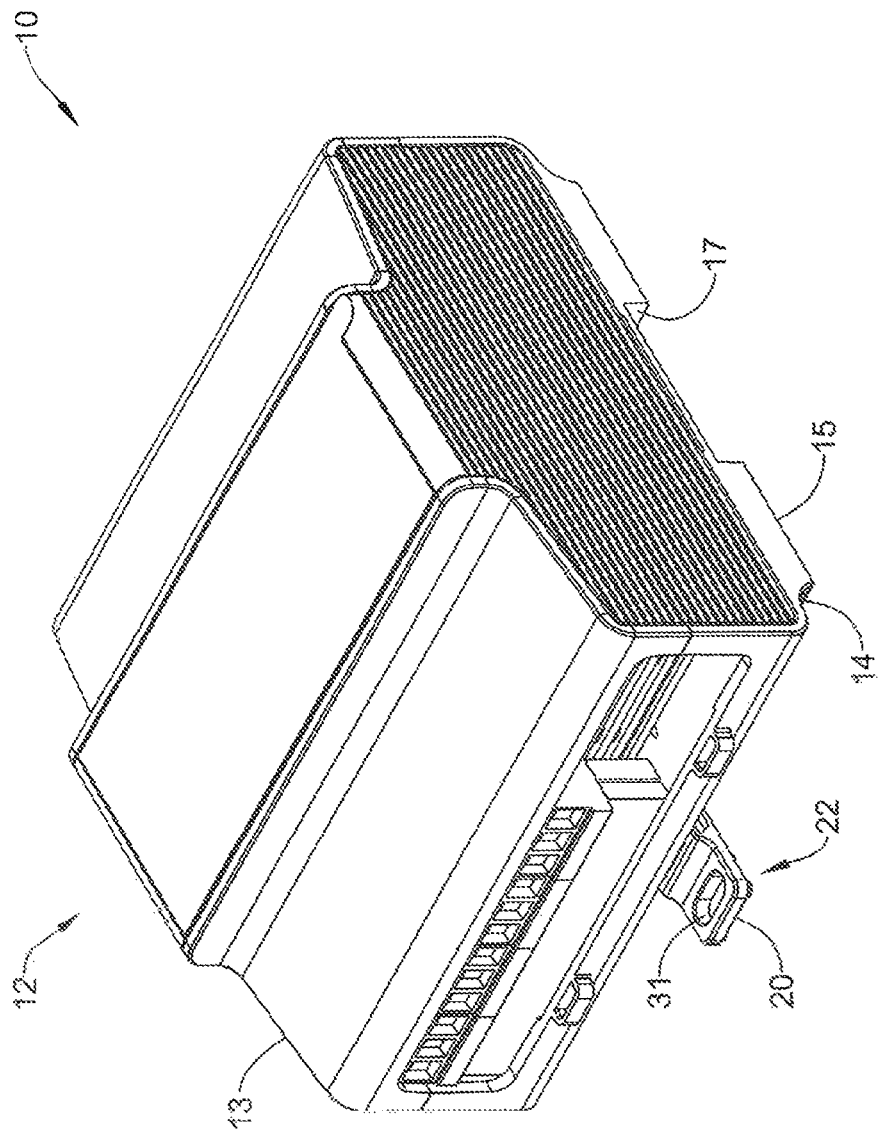
FIG. 1 is a perspective view of an illustrative building controller.

While the disclosure is amenable to various modifications and alternative forms, specifics thereof have been shown by way of example in the drawings and will be described in detail. It should be understood, however, that the intention is not to limit the disclosure to the particular examples described. On the contrary, the intention is to cover all modifications, equivalents, and alternatives falling within the spirit and scope of the disclosure.

DESCRIPTION

The following description should be read with reference to the drawings, in which like elements in different drawings are numbered in like fashion. The drawings, which are not necessarily to scale, depict examples that are not intended to limit the scope of the disclosure. Although examples are illustrated for the various elements, those skilled in the art will recognize that many of the examples provided have suitable alternatives that may be utilized.

FIG. 1 is a perspective view of an illustrative building controller 10. The illustrative building controller 10 may be any suitable building controller for controlling and monitoring one or more part of a building control system, such as an HVAC system, a security system, a lighting system, a fire suppression system, and/or any other suitable building control system. As shown in FIG. 1, the illustrative building controller 10 may include a housing 12 which may include a back plate 14 that is field configurable to be mounted to either a wall and/or a DIN rail. The back side 15 of the back plate may include a DIN rail receiving slot 17 for receiving at least part of a DIN rail. In some cases, the building controller 10 may include a user interface, which may include any suitable combination of displays, buttons, switches, and the like. The user interface (not shown) may be disposed on a front side 13 of the housing 12 of the building controller 10, but this is not required. In some cases, no user interface is provided.

Figure 2:
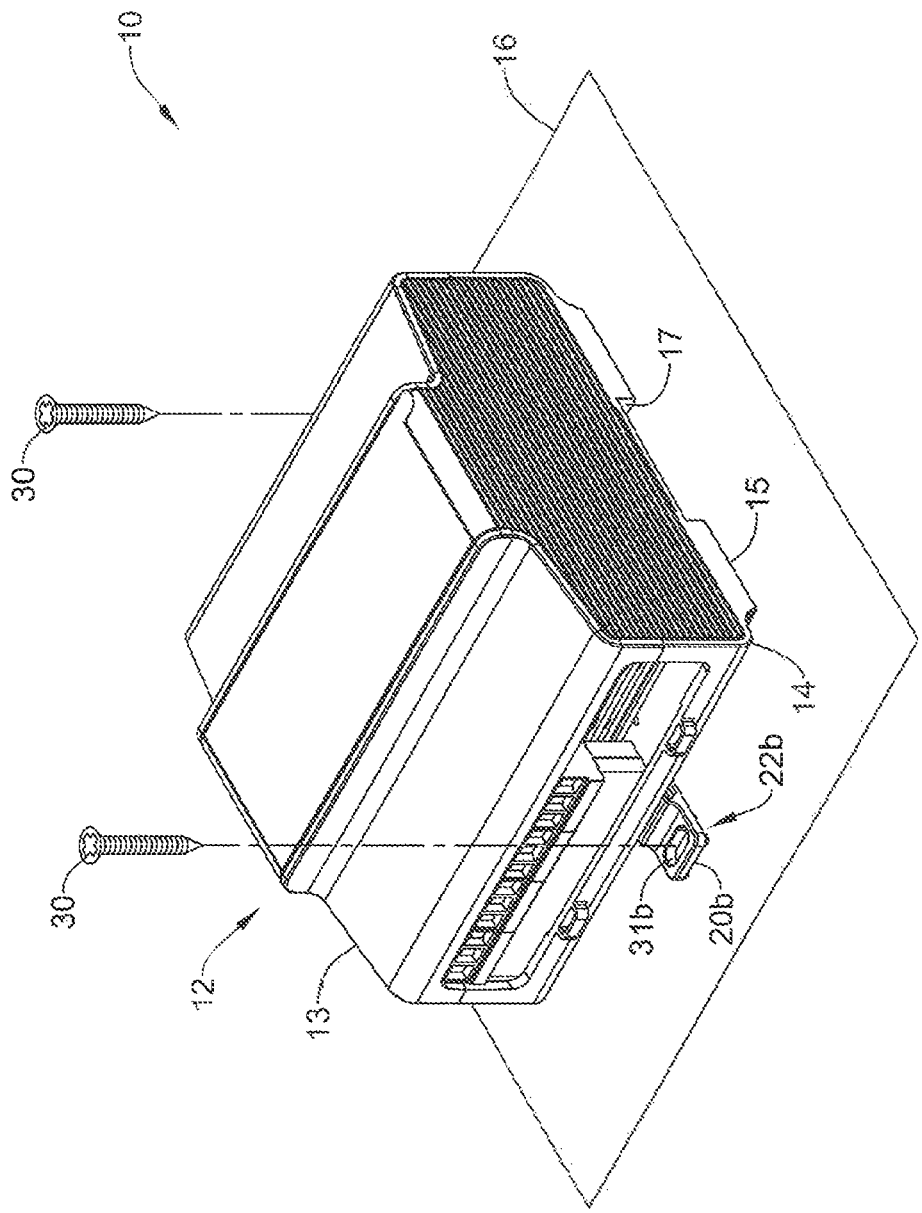
FIG. 2 is an exploded view of the illustrative building controller mounted to a wall.

It is contemplated that the back plate 14 may engage with a plurality of mounting clips 20. Each of the plurality of mounting clips 20 may include an inner end toward the DIN rail receiving slot 17 and an outer end 22 away from the DIN rail receiving slot 17. In some cases, the outer end 22 may include a hole 31, a recess and/or other feature or features that may be configured to receive or engage a fastener (as shown in FIG. 2) when the mounting clip is in a wall mount position so as to attach the mounting clip 20 and thus the building controller 10 to a wall. It is contemplated that the fastener may be any suitable fastener such as, for example, a screw, a nail, a bolt, a hook, a command strip, or the like. In some cases, the inner end 22 of the plurality of mounting clips 20 may be configured to engage a DIN rail (see FIG. 3) when the mounting clip is in a DIN rail mount position so as to attach the mounting clip 20 and thus the building controller 10 to the DIN rail 40.

Figure 3:
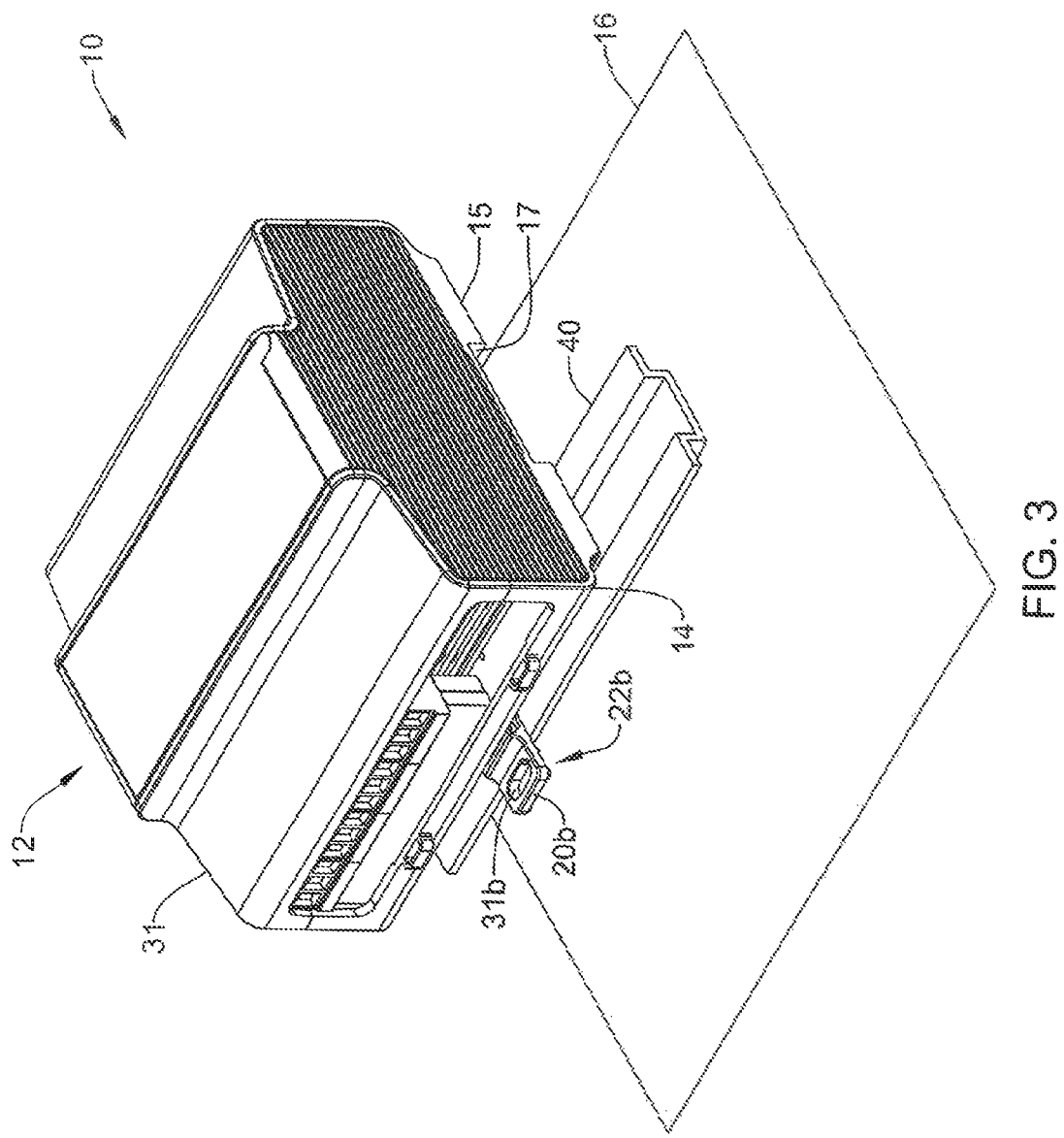
FIG. 3 is an exploded view of the illustrative building controller mounted to a DIN rail.
Figure 4:
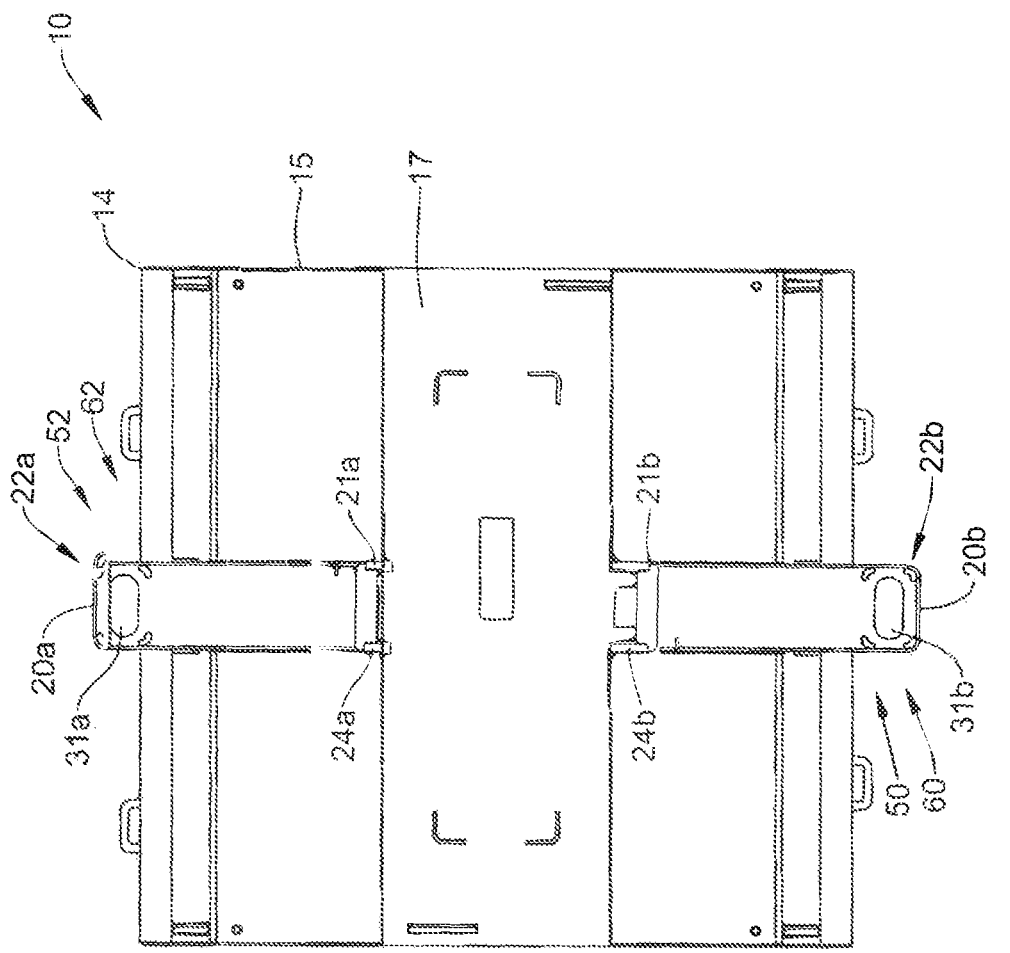
FIG. 4 is a schematic rear side view of an illustrative back plate of the housing of the building controller of FIGS. 1-3.

FIG. 2 is an exploded view of the illustrative building controller 10 mounted to a wall. In FIG. 2, the mounting clips 20a, 20b (hereinafter, collectively referred to as the mounting clips 20) are shown pulled out into an extended wall mount position. The mounting clips 20 may each include an inner end 21a, 21b (as best shown in FIG. 4) toward the DIN rail 40 and an outer end 22a, 22b (hereinafter, collectively referred to as the outer end 22) away from the DIN rail 40. The outer end 22 may define a hole 31a, 31b (hereinafter, collectively referred to as the hole 31), recess and/or other feature or features that may be configured to receive a fastener 30 for securing the mounting clips 20, and thus the building controller 10 to a wall 16. The fastener 30 may be any suitable fastener, such as, for example, a screw, a nail, a bolt, a hook, a command strip, or the like. FIG. 3 is an exploded view of the illustrative building controller 10 mounted to a DIN rail 40. In FIG. 3, the mounting clips 20a, 20b (hereinafter, collectively referred to as the mounting clips 20) are shown pushed into a retracted or DIN rail mount position. In the retracted or DIN rail mount position, the inner end 21a, 21b may engage the DIN rail 40 to secure the building controller 10 to the DIN rail 40.

In some cases, each of the mounting clips 20 may be configured to slide in a corresponding slot defined by the back plate 14 of the building controller 10. In some cases, the mounting clips 20 may slide between a full retracted DIN rail mount position (see FIG. 6), an intermediate DIN rail release position and an extended wall mount position (see FIG. 2). In the example shown in FIG. 2, the mounting clips 20 are pulled out into the extended wall mount position. In the example shown in FIG. 6, the mounting clips 20 are shown pushed into the retracted DIN rail mount position. An intermediate DIN rail release position, when provided, may be between the extended wall mount position and the retracted DIN rail mount position, and may release the inner ends 21a, 21b of the mounting clips from engaging the DIN rail 40, thereby allowing the building controller 10 to be removed from the DIN rail 40. In some cases, the mounting clips 20 may be configured to be held in a each of the DIN rail mount position, the intermediate DIN rail release position and the wall mount position by a detent or similar action, as further discussed herein.

The back plate 14 may be a sub-assembly of the building controller 10. In some instances, the back plate 14 and the building controller 10 may include a number of cooperating features (not explicitly shown), including one or more hinge structures, one or more latch structures, and the like, which may be configured to engage, mate, and cooperate with each other to form a releasably secure connection between the building controller 10 and the back plate 14. In some cases, the back plate 14 is not releasable from the building controller 10.

Figure 5:
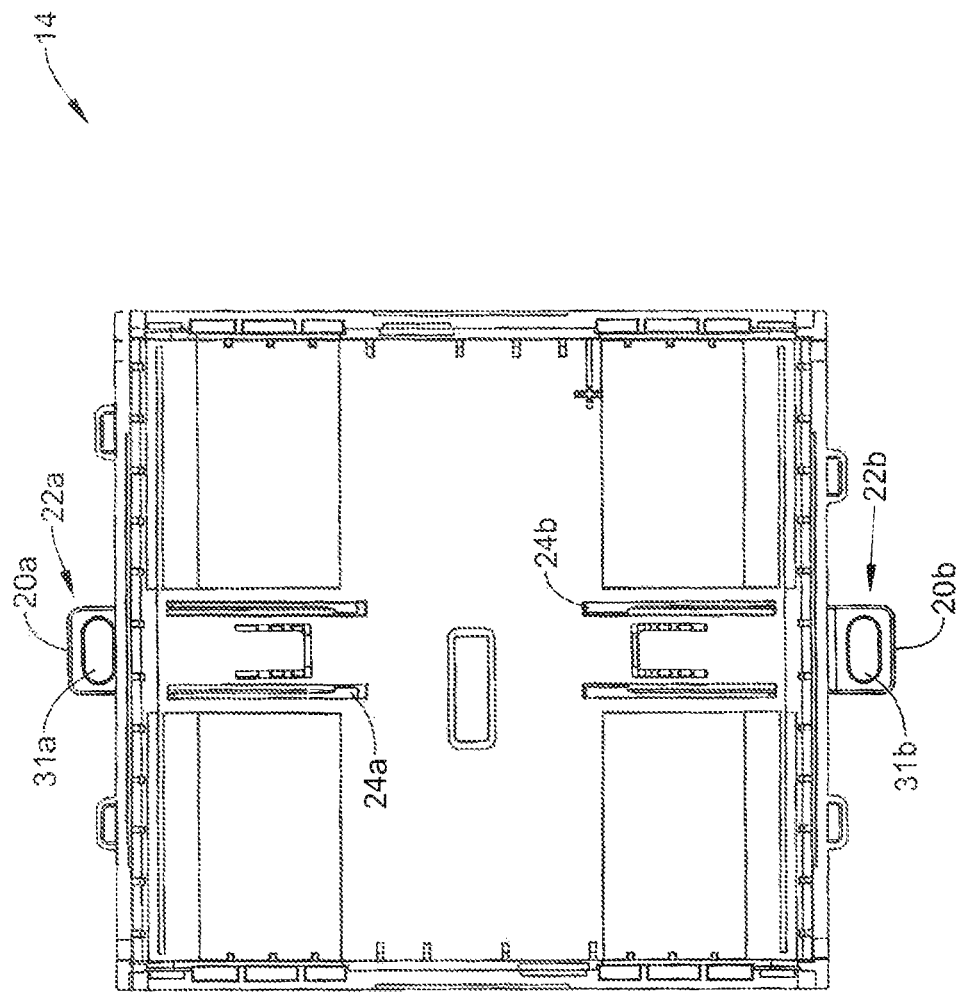
FIG. 5 is a front side view of the illustrative back plate of FIG. 4.

FIG. 4 is a schematic rear side view of an illustrative back plate 14 of the housing 12 of the building controller 10. FIG. 5 is a front side view of the illustrative back plate 14 of FIG. 4. As shown, the housing 12 of the building controller 10 include the back plate 14. The illustrative back plate 14 include a plurality of mounting clip slots 24a, 24b (hereinafter, collectively referred to as the mounting clip slots 24). The mounting clip slots 24 may be configured to receive the mounting clips 20 such that the mounting clips 20 may be slidably disposed relative to the back plate 14.

Figure 6:
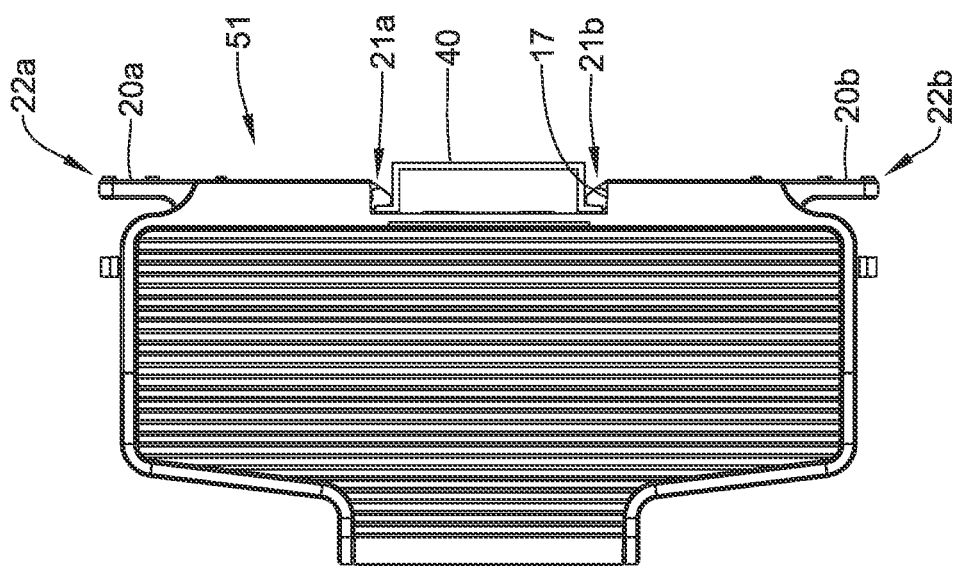
FIG. 6 is a side view of an illustrative building controller mounted to a DIN rail.

The mounting clips 20 may include an inner end 21a, 21b and an outer opposing end 22a, 22b, respectively, as detailed above. The inner end 21a, 21b of the mounting clips 20 may be configured to engage a DIN rail (e.g., DIN rail 40) when in a DIN rail mount position 51, as best shown in FIG. 6. In some cases, the outer end 22a, 22b of the mounting clips 20 may configured to accommodate a fastener (e.g., fastener 30) for securing the mounting clips 20, and thus the building controller 10, to a wall 16 when the mounting clips 20 are in a wall mount position 50, as best shown by the lower mounting clip 20b in FIG. 4. In such cases, when the mounting clips 20 are in the wall mount position 50, as illustrated by the mounting clip 20b in FIG. 4, a securement feature such as a hole 31b, a recess and/or other feature or features may be accessible for receiving a fastener 30 to secure the building controller 10 to a wall 16.

When in the wall mount position 50, the mounting clips 20 and the back plate 14 may be configured to hold the mounting clips 20 in the wall mount position 50 until at least a first threshold sliding force is applied to the mounting clips 20 to displace the mounting clips 20 from the wall mount position 50. In some cases, when in the DIN rail mount position 51, the mounting clips 20 and the back plate 14 may be configured to hold the mounting clips 20 in the DIN rail mount position 51 until at least a second threshold sliding force is applied to the mounting clips 20 to displace the mounting clips 20 from the DIN rail mount position 51. In some cases, the first threshold sliding force may be different from the second threshold sliding force by at least ten (10) percent. While indicated the first threshold sliding force may be different from the second threshold sliding force by at least ten (10) percent, the difference may be less than ten (10) percent (e.g., 5 percent, 7 percent, etc.) or the difference may be greater than ten (10) percent (e.g., 15 percent, 20 percent, 25 percent, etc.).

In some cases, the mounting clips 20 may slide within the respective mounting clip slots 24 from the DIN rail mount position 51 toward the wall mount position 50 to an intervening position 62, which is between the wall mount position 50 and the DIN rail mount position 51, as illustrated by the mounting clip 20a in FIG. 4. The intervening position 62 may include a DIN rail release position 52, in which the inner end 21a disengages from the DIN rail 40. When in the DIN rail release position 52, the mounting clips 20 and the back plate 14 may be configured to hold the mounting clips 20 in the DIN rail release position 52 until at least a third threshold sliding force is applied to the mounting clips 20 to displace the mounting clips 20 from the DIN rail release position 52 toward the DIN rail mount position 51. In some cases, at least a fourth threshold sliding force is applied to the mounting clips 20 to displace the mounting clips 20 from the DIN rail release position 52 toward the wall mount position 50. In some cases, the second threshold sliding force may be greater than the third threshold sliding force. In some cases, the second threshold sliding force may be less than the third threshold sliding force. In other cases, the fourth threshold sliding force may be greater than the third threshold sliding force by at least ten (10) percent. While indicated the fourth threshold sliding force may be greater than the third threshold sliding force by at least ten (10) percent, the difference may be less than ten (10) percent (e.g., 5 percent, 7 percent, etc.) or the difference may be greater than ten (10) percent (e.g., 15 percent, 20 percent, 25 percent, etc.).

Figure 8:
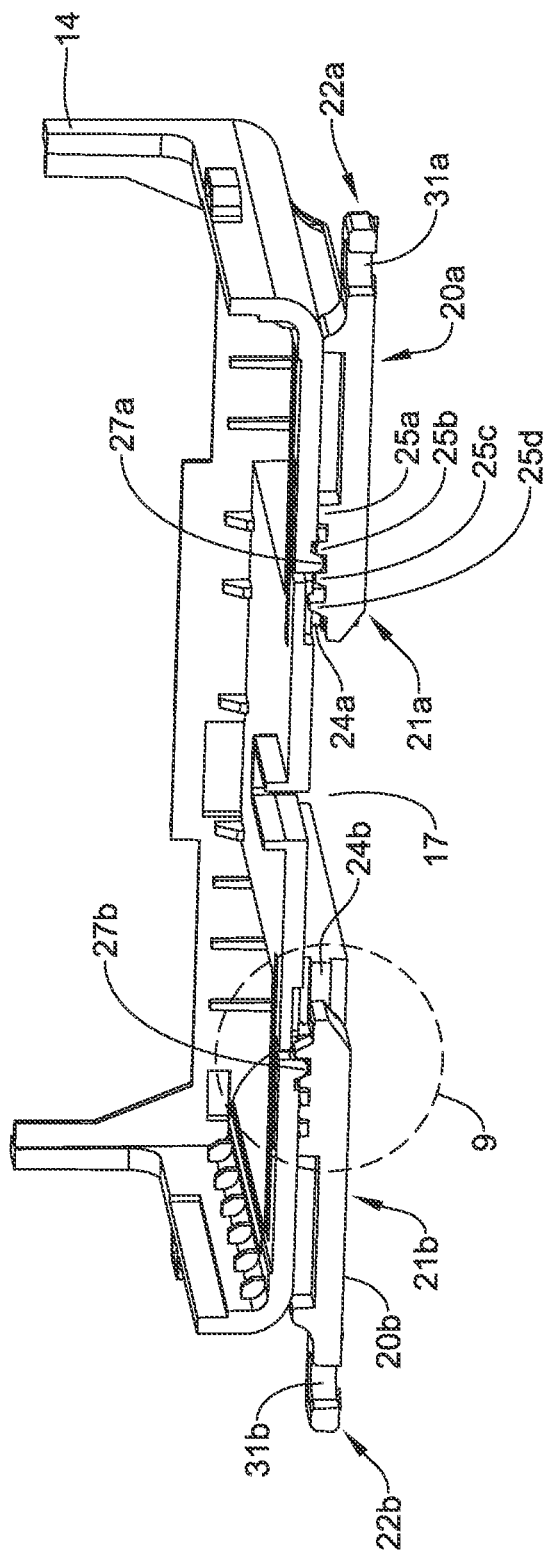
FIG. 8 is another perspective cross-sectional side view of an illustrative back plate of the building controller.
Figure 9:
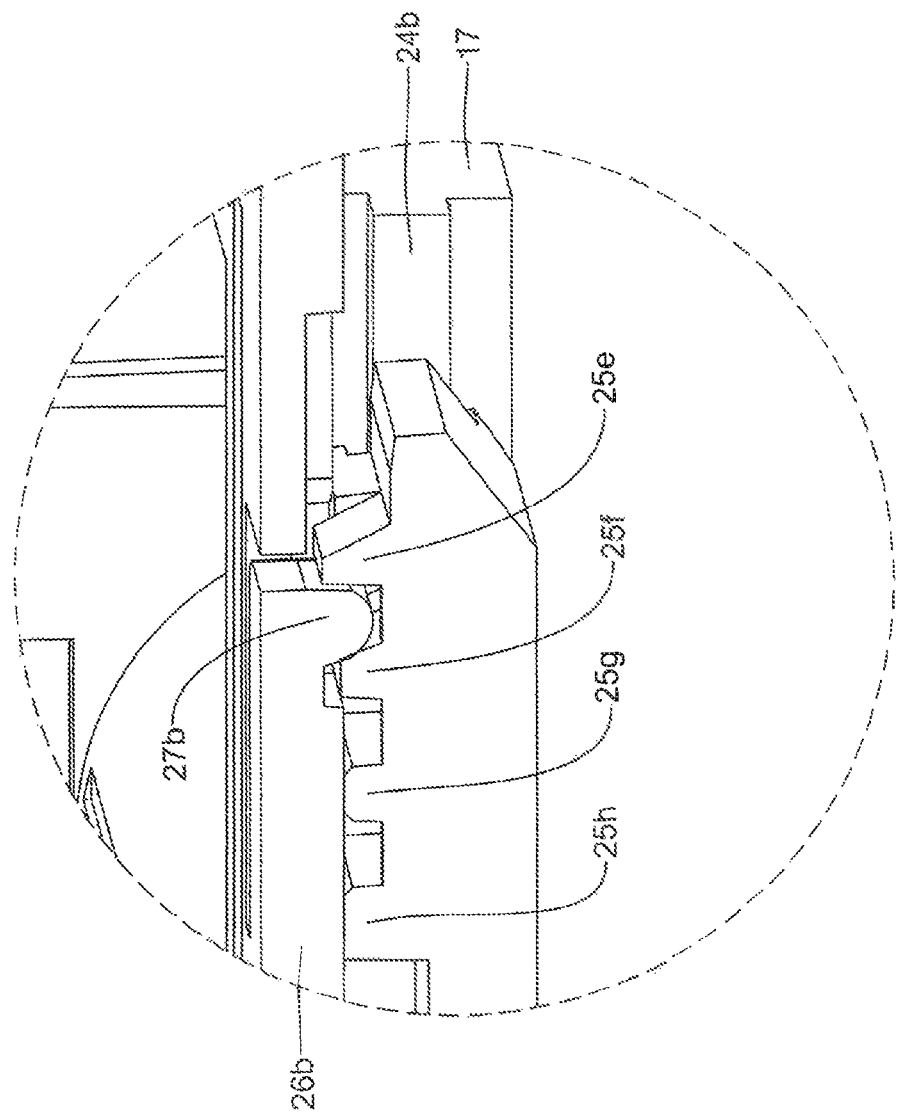
FIG. 9 is an enlarged perspective cross-sectional side view of illustrative detent action provided by the back plate of FIG. 8.
Figure 10:
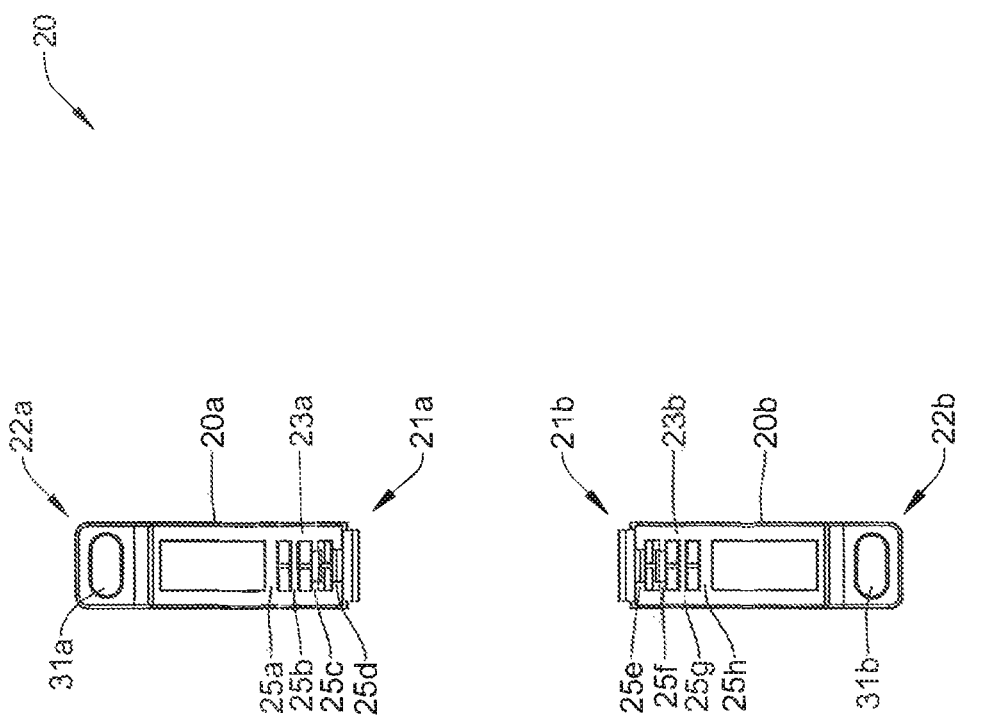
FIG. 10 is a front plan view of illustrative mounting clips.
Figure 11:
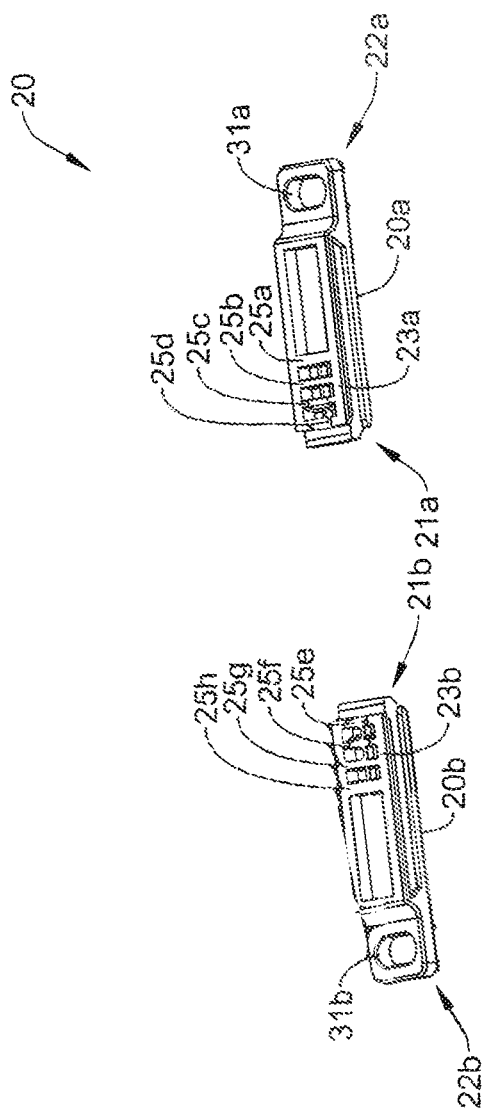
FIG. 11 is a perspective view of the illustrative mounting clips of FIG. 10.
Figure 12:
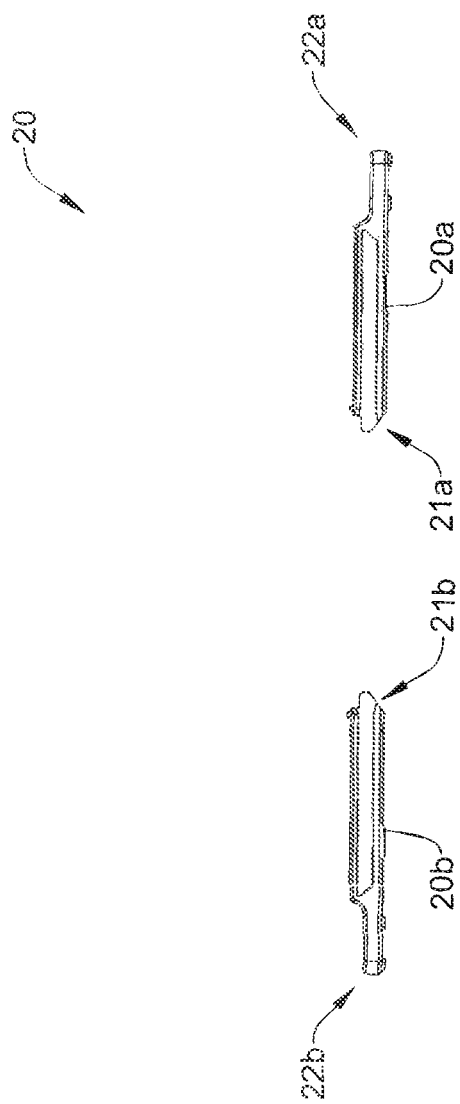
FIG. 12 is a side plan view of the illustrative mounting clips of FIG. 10.
Figure 13:
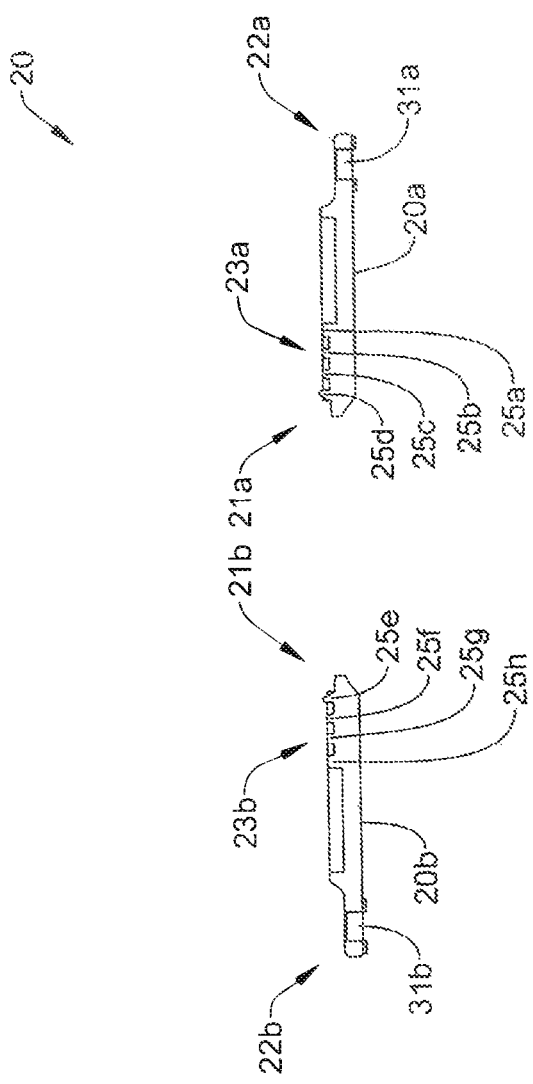
FIG. 13 is a cross-sectional side view of the illustrative mounting clips of FIG. 10.

FIG. 6 is a side view of the illustrative building controller 10 mounted to a DIN rail 40. As can be seen in FIG. 6, the mounting clips 20 may be in the DIN rail mount position 51. When the mounting clips 20 are in the DIN rail mount position 51, the mounting clips 20 and the back plate 14 may be configured to hold the mounting clips 20 in the DIN rail mount position 51 until at least a second threshold sliding force is applied to the mounting clips 20 to displace the mounting clips 20 from the DIN rail mount position 51. In some cases, one or more of the mounting clips 20 and the back plate 14 may define a detent (as best shown in FIGS. 8 and 9) that may be configured to hold the mounting clips 20 in the DIN rail mount position 51. The inner end 21a, 21b of the mounting clips 20 may be configured to slide over the DIN rail and snap into place when the detent reaches the DIN rail mount position 51. When the mounting clips 20 are in the DIN rail mount position 51, the hole 31 may not be accessible and thereby may not be configured to receive a fastener (e.g., fastener 30), but this is not required.

Figure 7:
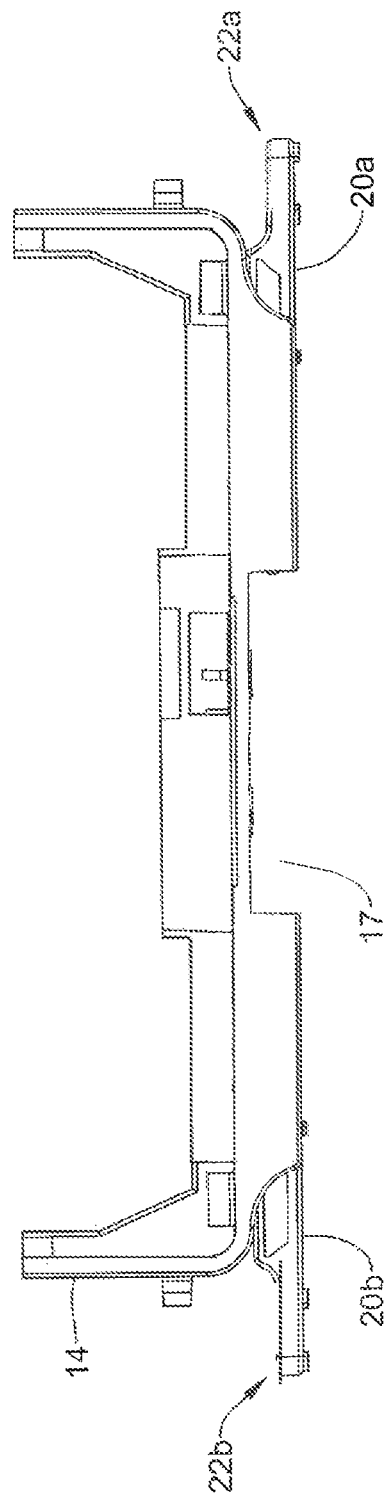
FIG. 7 is a cross-sectional side view of an illustrative back plate of the building controller.

FIG. 7 is a cross-sectional side view of an illustrative back plate 14 of the building controller 10. FIG. 8 is another perspective cross-sectional side view of the illustrative back plate of the building controller 10. FIG. 9 is an enlarged perspective cross-sectional side view of illustrative detent action provided by the back plate 14 of FIG. 8. As discussed with reference to FIG. 1, the back plate 14 of the housing 12 may include the plurality of mounting clips 20. For each of the plurality of mounting clips 20 (e.g., mounting clip 20b in FIG. 9) when in the wall mount position 50, the respective mounting clip 20b and the back plate 14 are configured to hold the respective mounting clip 20b in the wall mount position 50 until at least the first threshold sliding force is applied to the respective mounting clip 20b to displace the respective mounting clip 20b from the wall mount position 50. When in the DIN rail mount position 51, the respective mounting clip 20b and the back plate 14 are configured to hold the respective mounting clip 20b in the DIN rail mount position 51 until at least the second threshold sliding force is applied to the respective mounting clip 20b to displace the respective mounting clip 20b from the DIN rail mount position 51.

In some cases, one or more of the mounting clips 20 and the back plate 14 define one or more detents that are configured to hold the mounting clip 20 in the wall mount position 50 until at least the first threshold sliding force is applied to the mounting clips 20 to displace the mounting clips 20 along the mounting clip slots 24 from the wall mount position 50. In some cases, one or more of the mounting clips 20 and the back plate 14 define one or more detents that are configured to hold the mounting clips 20 in the DIN rail mount position 51 until at least the second threshold sliding force is applied to the mounting clips 20 to displace the mounting clips 20 along the mounting clip slots 24 from the DIN rail mount position 51. The one or more detents may include a lever 26a, 26b (hereinafter, collectively referred to as lever 26) and a tang 27a, 27b (hereinafter, collectively referred to as tang 27) defined by the back plate 14. As shown in FIGS. 8 and 9, the mounting clips 20 may include a plurality of ridges 25a, 25b, 25c, 25d, 25e, 25f, 25g, and 25h (hereinafter, collectively referred to as ridges 25). The ridges 25 of the mounting clips 20 may be configured to engage with the tang 27 such that the tang 27 may be configured to move against the bias of the lever 26 and away from the mounting clips 20 when the tang 27 engages each of the ridges 25 of the mounting clips 20 as a sliding force is applied to the mounting clips 20.

The ridges 25 of the mounting clips 20 may include a first ridge 25d, 25e that may have a height larger than that of the remaining ridges 25. The ridges 25d and 25e may engage with the lever 26 and the tang 27 of the back plate 14 so as to provide a stop such that the mounting clips 20 cannot be removed from the back plate 14. Thus, the mounting clips 20 may slide within the mounting clip sots 24 from the wall mount position 50 to the DIN rail mount position 51 without disengaging completely from the back plate 14. The height and shape of the other ridges are set to define the first, second, third and/or fourth threshold levels of sliding force for moving the mounting clips between the various positions, including the wall mount position, the DIN rail mount position and the intermediate position. For example, a higher ridge will increase the force required to move the tang 27 over the ridge, thereby increasing the corresponding threshold level of sliding force. Also, a ridge that has a more gradual sloped edge will decrease the initial force required to move the tang 27 over the ridge. The size, shape and spacing of the ridges can be tailored to help achieve a desired threshold level of sliding force between positions. In some cases, a depth and/or shape of a valley between ridges may be tailored to help achieve a desired threshold level of sliding force between positions.

FIGS. 10-13 are illustrative views of the one or more mounting clips 20. The mounting clips 20 may each include the first end 21 and the outer end 22. The outer end 22 may define a hole 31 which may be configured to receive a fastener for securing the mounting clips 20, and thus the building controller 10, to a wall and/or to a DIN rail. The mounting clips 20 may include a plurality of ridges 25a, 25b, 25c, 25d, 25e, 25f, 25g, and 25h (ridges 25). The ridges 25 of the mounting clips 20 may be configured to engage with the tang 27 and the lever 26 of the back plate 14.

Figure 14:
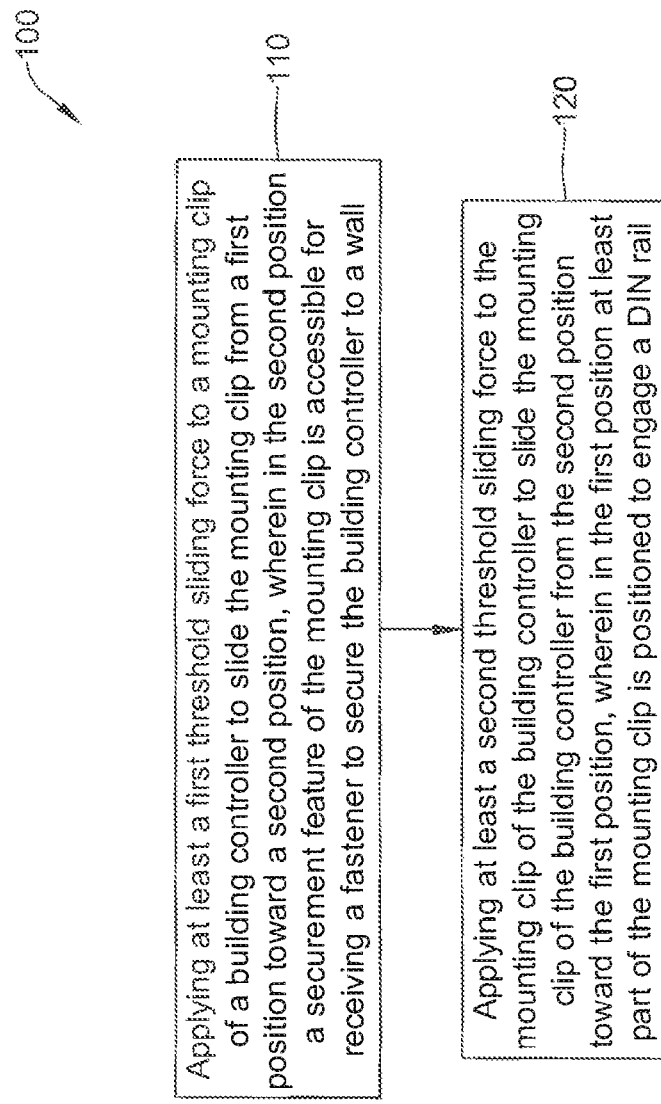
FIG. 14 is a flow chart showing an illustrative method of changing a mounting configuration of a building controller.

FIG. 14 is a flow diagram showing an illustrative method 100 of changing a mounting configuration of a building controller. The method 100 may include applying at least a first threshold sliding force to a mounting clip (e.g., one or more mounting clips 20) of a building controller (e.g., building controller 10), to slide the mounting clip from a first position toward a second position, wherein in the second position, a securement feature of the mounting clip is accessible for receiving a fastener to secure the building controller to a wall, as referenced by block 110. The method 100 may further include applying at least a second threshold sliding force to the mounting clip of the building controller to slide the mounting clip of the building controller from the second position toward the first position, wherein in the first position, at least part of the mounting clip is positioned to engage a DIN rail, as referenced by block 120. In some cases, the first threshold sliding force may be different from the second threshold sliding force by at least ten (10) percent.

In some cases, there may be an intervening position between the first position and the second position. In such cases, the method 100 may include applying at least a third threshold sliding force to the mounting clip of the building controller to slide the mounting clip from the intervening position to the first position. The method 100 may further include applying at least a fourth threshold sliding force to the mounting clip of the building controller to slide the mounting clip from the intervening position to the second position. In some cases, the fourth threshold sliding force may be greater than the third threshold sliding force by at least ten (10) percent.

All numbers are herein assumed to be modified by the term "about", unless the content clearly dictates otherwise. The recitation of numerical ranged by endpoints includes all numbers subsumed within that range (e.g., 1 to 5 includes, 1, 1.5, 2, 2.75, 3, 3.8, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

Having thus described several illustrative embodiments of the present disclosure, those of skill in the art will readily appreciate that yet other embodiments may be made and used within the scope of the claims hereto attached. It will be understood, however, that this disclosure is, in many respects, only illustrative. Changes may be made in details, particularly in matters of shape, size, arrangement of parts, and exclusion and order of steps, without exceeding the scope of the disclosure. The disclosure's scope is, of course, defined in the language in which the appended claims are expressed.

What is claimed is:

1. A building controller configured to be mountable to a wall in some installations and to a DIN rail in other installations, the building controller comprising:
a housing having a back plate;
a mounting clip slidably disposed relative to the back plate between a wall mount position used when mounting the building controller to the wall, a DIN rail mount position used when mounting the building controller to the DIN rail, and a DIN rail release position between the wall mount position and the DIN rail mount position, wherein, in the DIN rail release position, the mounting clip is configured to disengage from the DIN rail, and wherein:
when in the wall mount position, the mounting clip and the back plate are configured to hold the mounting clip via one or more of a plurality of detents in the wall mount position until at least a first threshold sliding force is applied to the mounting clip to displace the mounting clip from the wall mount position;
when in the DIN rail mount position, the mounting clip and the back plate are configured to hold the mounting clip via one or more of the plurality of detents in the DIN rail mount position until at least a second threshold sliding force is applied to the mounting clip to displace the mounting clip from the DIN rail mount position;
when in the DIN rail release position, the mounting clip and the back plate are configured to hold the mounting clip via one or more of the plurality of detents in the DIN rail release position until:
either at least a third threshold sliding force is applied to the mounting clip to displace the mounting clip from the DIN rail release position toward the DIN rail mount position
or at least a fourth threshold sliding force is applied to the mounting clip to displace the mounting clip from the DIN rail release position toward the wall mount position; and
the fourth threshold sliding force is greater than the third threshold sliding force.

2. The building controller of claim 1, wherein the second threshold sliding force is greater than the third threshold sliding force.

3. The building controller of claim 1, wherein the mounting clip comprises a first end and a second opposing end, the first end configured to engage the DIN rail when the mounting clip is in the DIN rail mount position, and the second opposing end is configured to accommodate a fastener for securing the mounting clip and thus the building controller to the wall when the mounting clip is in the wall mount position.

4. The building controller of claim 3, wherein the second opposing end defines a hole that is configured to receive the fastener when the mounting clip is in the wall mount position, wherein the fastener is one of a screw, a nail or a bolt.

5. The building controller of claim 1, wherein the mounting clip is slidably disposed relative to the back plate in a mounting clip slot defined by the back plate.

6. The building controller of claim 1, wherein one or more of the mounting clip and back plate define the plurality of detents.

7. The building controller of claim 1 comprising:
a plurality of mounting clips, wherein each respective mounting clip of the plurality of mounting clips is slidably disposed relative to the back plate between the wall mount position used when mounting the building controller to the wall, the DIN rail mount position used when mounting the building controller to the DIN rail, and the DIN rail release position between the wall mount position and the DIN rail mount position, wherein, in the DIN rail release position, each respective mounting clip of the plurality of mounting clips is configured to disengage from the DIN rail, and wherein for each respective mounting clip of the plurality of mounting clips:

when in the wall mount position, the respective mounting clip and the back plate are configured to hold the respective mounting clip via one or more of the plurality of detents in the wall mount position until at least the first threshold sliding force is applied to the respective mounting clip to displace the respective mounting clip from the wall mount position;

when in the DIN rail mount position, the respective mounting clip and the back plate are configured to hold the respective mounting clip via one or more of the plurality of detents in the DIN rail mount position until at least the second threshold sliding force is applied to the respective mounting clip to displace the respective mounting clip from the DIN rail mount position; and when in the DIN rail release position, the respective mounting clip and the back plate are configured to hold the respective mounting clip via one or more of the plurality of detents in the DIN rail release position until:
either at least the third threshold sliding force is applied to the respective mounting clip to displace the respective mounting clip from the DIN rail release position toward the DIN rail mount position
or at least the fourth threshold sliding force is applied to the respective mounting clip to displace the respective mounting clip from the DIN rail release position toward the wall mount position; and the fourth threshold sliding force is greater than the third threshold sliding force.

8. A building controller comprising:
a housing having a back plate, the back plate defining a slot;
a mounting clip configured to fit within and slide along the slot;
wherein the mounting clip and/or the back plate define one or more detents that:
hold the mounting clip in a first mount position until at least a first threshold sliding force is applied to the mounting clip to displace the mounting clip along the slot from the first mount position;
hold the mounting clip in a second mount position until at least a second threshold sliding force is applied to the mounting clip to displace the mounting clip along the slot from the second mount position; and
wherein the first threshold sliding force is different from the second threshold sliding force by at least 10 percent.

9. The building controller of claim 8, further comprising an intervening position between the first mount position and the second mount position, wherein the one or more detents are configured to hold the mounting clip in the intervening position until:
at least a third threshold sliding force is applied to the mounting clip to displace the mounting clip along the slot from the intervening position toward the first mount position; and
at least a fourth threshold sliding force is applied to the mounting clip to displace the mounting clip along the slot from the intervening position toward the second mount position;
wherein the third threshold sliding force is different from the fourth threshold sliding force by at least 10 percent.

10. The building controller of claim 9, wherein the first mount position is a wall mount position, the second mount position is a DIN rail mount position and the intervening position is a DIN rail release position.

11. The building controller of claim 8 wherein the one or more detents comprise a lever and a tang defined by the back plate, wherein the lever is configured to bias the tang against the mounting clip, wherein the mounting clip comprises a ridge and the tang is configured to move against the bias of the lever and away from the mounting clip when the tang engages the ridge of the mounting clip as the first threshold sliding force is applied to the mounting clip.

12. The building controller of claim 11 wherein the mounting clip comprises a plurality of ridges and the tang is configured to move against the bias of the lever and away from the mounting clip when the tang engages each of the plurality of ridges of the mounting clip.

13. A method comprising:
applying at least a first threshold sliding force to a mounting clip of a building controller to overcome one or more of a plurality of detents while sliding the mounting clip from a first position toward a second position, wherein in the second position a securement feature of the mounting clip is accessible for receiving a fastener to secure the building controller to a wall;
applying at least a second threshold sliding force to the mounting clip of the building controller to overcome one or more of the plurality of detents while sliding the mounting clip of the building controller from the second position toward the first position, wherein in the first position at least part of the mounting clip is positioned to engage a DIN rail;
applying at least a third threshold sliding force to the mounting clip of the building controller to overcome one or more of the plurality of detents while sliding the mounting clip toward the first position from an intervening position that is between the first position and the second position;
applying at least a fourth threshold sliding force to the mounting clip of the building controller to overcome one or more of the plurality of detents while sliding the mounting clip from the intervening position toward the second position; and
wherein the first threshold sliding force is different from the second threshold sliding force by at least 10 percent and/or the fourth threshold sliding force is different from the third threshold sliding force by at least 10 percent.

* * * * *